United States Patent [19]
Adair et al.

[11] Patent Number: 4,921,832
[45] Date of Patent: May 1, 1990

[54] DEVELOPER COMPOSITIONS HAVING REDUCED YELLOWING

[76] Inventors: Paul C. Adair, 8307 Bunnel Hill Rd., Springboro, Ohio 45066; Cheryl L. Moore; Robert A. Landis, all c/o The Mead Corporation, Courthouse Plaza Northeast, Dayton, Ohio 45463

[21] Appl. No.: 184,735

[22] Filed: Apr. 22, 1988

[51] Int. Cl.$^5$ .................. B41M 5/22; G03C 1/68; G03C 5/54
[52] U.S. Cl. .................. 503/201; 430/138; 430/211; 430/235; 430/933; 503/209; 503/210; 503/211; 503/212; 503/216; 503/225
[58] Field of Search ............ 427/150–152; 428/913, 914; 503/208, 209, 225, 226, 215, 200, 201, 210–212, 216; 430/138, 211, 235, 933

[56] References Cited

U.S. PATENT DOCUMENTS

| | | | |
|---|---|---|---|
| 3,004,896 | 10/1961 | Heller et al. | 167/90 |
| 4,170,483 | 10/1979 | Shackle et al. | 427/150 |
| 4,260,179 | 4/1981 | Yamaguch et al. | 428/914 |
| 4,262,938 | 4/1981 | Yamaguch et al. | 428/914 |
| 4,296,948 | 10/1981 | Satoh et al. | 428/914 |
| 4,379,721 | 4/1983 | Qualitz et al. | 106/21 |
| 4,400,437 | 8/1983 | Oeda | 428/913 |
| 4,400,492 | 8/1983 | Asano et al. | 503/225 |
| 4,482,378 | 11/1984 | Riou et al. | 503/210 |
| 4,511,909 | 4/1985 | Arai | 503/208 |
| 4,550,329 | 10/1985 | Gonda et al. | 503/214 |
| 4,663,642 | 5/1987 | Kameda et al. | 503/217 |

FOREIGN PATENT DOCUMENTS

| | | | |
|---|---|---|---|
| 789359 | 8/1979 | Japan | 503/209 |
| 55-93492 | 7/1980 | Japan | 503/209 |
| 56-40590 | 4/1981 | Japan | 503/209 |

*Primary Examiner*—Bruce H. Hess
*Attorney, Agent, or Firm*—Thompson, Hine and Flory

[57] ABSTRACT

The present invention provides a developer sheet useful in forming reproductions having a controllable gloss finish and reduced photolytic yellowing. The developer sheet comprises a support having a layer of a finely divided, thermoplastic, phenolic developer material and an anti-yellowing agent on the surface thereof. The phenolic developer material is capable of reacting with a color former to produce a visible image and is capable of coalescing into a thin film which imparts gloss to the image upon the application of heat.

18 Claims, No Drawings

1

DEVELOPER COMPOSITIONS HAVING REDUCED YELLOWING

BACKGROUND OF THE INVENTION

The present invention relates to glossable developer compositions of the type which are useful in recording materials such as carbonless paper and photographic materials employing encapsulated photosensitive compositions where they function as electron acceptors and react with substantially colorless electron donating compounds to produce a visible image.

Prolonged exposure of phenolic developers to heat and/or sunlight results in degradation of the developer. When phenolic developers are used on a developer sheet, such degradation is accompanied by yellowing. This reduces the commercial value of the recording system. Attempts have been made to reduce the tendency for phenolic developers to yellow for this reason.

U.S. Pat. Nos. 4,260,179; 4,262,938; and 4,296,948 teach the addition of zinc oxide and titanium dioxide to reduce yellowing in developer sheets.

Japanese Published Application 78/9359 discloses a developer composition for pressure-sensitive copy paper comprising 100 parts of a phenol-formaldehyde polymer, a disubstituted phenol and a hydroxyphenylbenzotriazole compound.

SUMMARY OF THE INVENTION

The present invention provides an improved developer sheet useful in forming reproductions having a controllable gloss finish and reduced photolytic yellowing or in forming transparencies having reduced photolytic yellowing. The developer sheet comprises a support having a layer of a finely divided, thermoplastic, phenolic developer material and an anti-yellowing agent on the surface thereof The anti-yellowing agent can be an ultraviolet absorber, an optical brightener or a combination thereof. The phenolic developer material is a material which is both capable of reacting with a color former to produce a visible image and capable of coalescing into a thin film which imparts gloss to the image upon the application of heat.

Ultraviolet absorbers prevent yellowing by preventing ultraviolet radiation from interacting with the phenolic developer material. When a developer sheet having phenolic developer material and ultraviolet absorber thereon is exposed to sunlight, photolytic yellowing of the phenolic developer material is decreased. Optical brighteners, also referred to as fluorescent whitening agents or fluorescent brightening agents, compensate for the yellow cast which occurs on aging. The yellow cast is produced by the absorption of short wavelength light. With optical brighteners, this lost light is replaced such that a complete white is obtained. This additional light is produced by the brightener by fluorescence. Optical brightening agents absorb the invisible ultraviolet portion of the spectrum and convert this energy into longer wavelength light.

The present invention also provides an imaging system comprising an imaging sheet including a support having a layer of microcapsules on the surface thereof and a developer sheet including a support having a finely divided, thermoplastic phenolic developer material and an anti-yellowing agent. The microcapsules have an internal phase of a photosensitive composition and a color former. The phenolic developer material is capable of reacting with a color former to produce a visible image and is capable of coalescing into a thin film which imparts gloss to the image upon the application of heat.

DETAILED DESCRIPTION OF THE INVENTION

The present invention is an improvement in the developer composition and developer sheet described in commonly assigned copending application Ser. No. 073,036, filed July 14, 1987.

Ultraviolet absorbers useful in the present invention can be selected from among ultraviolet absorbers known in the art. Particularly preferred ultraviolet absorbers are compounds which are miscible with thermoplastic phenolic developer resin when melted.

One example of one class of an ultraviolet absorber which is particularly useful in the present invention is hydroxyphenylbenzotriazoles. Useful hydroxyphenylbenzotriazoles include:

2-(2'-hydroxy-5'-methylphenyl)benzotrizole;
2-(2'-hydroxy-5'-t-butylphenyl)benzotriazole;
2-(2'-hydroxy-5'-cyclohexylphenyl)benzotriazole;
2-(2'-hydroxy-5'-carbethoxyphenyl)benzotriazole;
2-(2'-hydroxy-5'-methoxyphenyl)benzotriazole;
2-(2'-hydroxy-5'-phenylphenyl)benzotriazole;
2-(2'-hydroxy-5'-amylphenyl)benzotriazole;
2-(2'-hydroxy-3',5'-di-methylphenyl)benzotriazole;
2-(2'-hydroxy-4',5'-dichlorophenyl)benzotriazole;
2-(2'-hydroxy-3'-methyl-5'-5-butylphenyl)benzotriazole;
2-(2'-hydroxy-3',5'-di-methylphenyl)-5-methylbenzotriazole;
2-(2'-hydroxy-3',5'-di-methylphenyl)-5-methoxybenzotriazole;
2-(2'-hydroxy-5 -butylphenyl)-5-chlorobenzotriazole;
2-(2'-hydroxy-5'-cyclohexylphenyl)-5-chlorobenzotriazole;
2-(2'-hydroxy-5'-phenylphenyl)-5-chlorobenzotriazole;
2-(2'-hydroxy-3',5'-di-t-butylphenyl)-5chlorobenzotriazole; 2
2-(2'-hydroxy-3+-t-butyl5'-methylphenyl)5-chlorobenzotriazole; and 2
2-(2'-hydroxy-5'-methylphenyl)-5,6-dichlorobenzotriazole. Preferred hydroxyphenylbenzotriazoles are 2-(2'-hydroxy-3',5'-di-t-butylphenyl)-5'-chlorobenzotriazole and 2
2-(2'-hydroxy-3'-t-butyl-5'-methylphenyl)-5- chlorobenzotriazole which are commercially available from Ciba-Geigy under the designations Tinuvin 327 and 326 respectively.

The ultraviolet absorber is mixed with phenolic developer material, and the mixture is coated onto a support. When the developer sheet is heated to gloss the phenolic developer, the absorber preferably dissolves in the phenolic developer and prevents photolytic yellowing.

Optical brighteners useful in the present invention are compounds which fluoresce upon excitation with UV light, emitting blue light. Most optical brighteners are derivatives of stilbene, 4,4'-diaminostilbene, biphenyl, triazoles, oxazoles, imidazoles, coumarins, naphthalimide, and triazine. Representative examples include 4,4-bis(triazin-2-ylamino)stilbene-2,2'-disulfonic acids, mono(azol-2-yl)stilbenes, 2-(stilben-4-yl)naphthotriazoles, -(4-phenylstilben-4-yl)benzoxazoles, bis(azol-2-yl) stilbenes, 4,4'-bis(triazol-2-yl)stilbene-2,2'-disulfonic acids, 1,4-bis(styryl)benzenes, 4,4'-bis(styryl)- biphenyls, 1,3-diphenyl-2-pyrazolines, bis(benzoxazol-2-yl) derivatives, bis(benzimidazol-2-yl) derivatives, 2-(benzofuran-2-yl)benzimidazoles, 7-hydroxy and 7-(substituted amino)coumarins, 3-phenyl-7-(triazin-2-ylamino)coumarins, carbostyrils, naphthalimides, derivatives of dibenzothiophene-5,5-dioxide, pyrene derivatives, and pyridotriazoles. Specific examples of useful optical brighteners are provided in The Encyclopedia of Chemical Technology, Volume 4, pages 213 to 224.

The phenolic developers used in the present invention are resins capable of reacting with a color former to produce a visible image and subsequently being coalesced into a continuous film. This film is essentially transparent. It imparts a gloss finish when the image is formed on an opaque background and it transmits light efficiently when the image is formed on a transparent background to provide a transparency. The degree of gloss can be adjusted by controlling the coalescence conditions, e.g., heat treatment. Thus, by limiting coalescence, finishes ranging from matte to high gloss (20% to 90% gloss) can also be provided. These developer materials are particularly useful in the present invention. Heating the developer layer also serves to melt the ultraviolet absorber particles and distribute them throughout the developer layer.

The phenolic developer materials used in the present invention are finely divided thermoplastics. Their softening points typically range from about 100° to 200° C., but those skilled in the art will appreciate that materials with higher and lower softening points may also be useful. The particle size is preferably in the range of about 0.5 to 25 microns.

Phenolic resins have been conventionally used as developer materials in pressure-sensitive recording materials. These resins may be the condensation product of phenols (including substituted phenols) and formaldehyde. The resins may be further modified to include amounts of salicylic acid or substituted salicylic acids in a manner known in the art.

Examples of phenolic resins useful in the present invention are described in U.S. Pat. Nos. 3,455,721; 3,466,184; 3,672,935; 4,025,490; and 4,226,962.

Another class of phenolic resin useful in the present invention is the products of oxidative coupling of substituted or unsubstituted phenols or biphenols. Oxidative coupling may be catalyzed by various catalysts but a particularly desirable catalyst is the enzyme horseradish peroxidase. A particularly desirable developer is the product of oxidative coupling of bisphenol A and is discussed below.

The phenolic developers used in the present invention may be metallated to improve their developing characteristics. They may be metallated by reaction with a salt selected from the group consisting of copper, zinc, aluminum, tin, cobalt, and nickel. Most typically, the resins are zincated to improve development. The metal content of the resins generally is about 1 to 5% by weight but may range up to 15%.

Preferably, developer materials such as phenolformaldehyde condensation products are used. More particularly, alkylphenolic resins, and still more particularly, metallated products of alkylphenolic resins are used. The alkyl phenols are monosubstituted by an alkyl group which may contain 1 to 12 carbon atoms. Examples of alkyl phenols are ortho- or para-substituted ethylphenol, propylphenol, butylphenol, amylphenol, hexylphenol, heptylphenol, octylphenol, nonylphenol, t-butylphenol, t-octylphenol, etc.

Another class of thermoplastic developer material is a resin-like condensation product of a polyvalent metal salt, such as a zinc salt, and a phenol, phenol-formaldehyde condensation product, or a phenol-salicylic acid-formaldehyde condensation product. This developer material is available from Schenectady Chemical Co. under the designation HRJ 4250 and HRJ 4542. These products are reported to be a metallated condensation product of an ortho- or para-substituted alkylphenol, a substituted salicylic acid, and formaldehyde.

It is critical that the developer materials of the present invention be present on the surface of the developer sheet as finely divided particles or microspheres. These particles provide a high reactive surface area and present pores and capillaries on the surface of the sheet which draw color former into the developer layer.

Finely divided thermoplastic developer materials useful in the present invention may be obtained by several processes. A developer material can be prepared in a conventional manner and a melt of the material can be atomized or the developer can be ground. Alternatively, a melt of the developer material can be injected into rapidly agitated aqueous medium whereupon the melt is solidified as droplets which are recovered. The developer material can also be dissolved in a solvent/non-solvent system and the solvent removed. Other materials such as Schenectady HRJ 4250 and HRJ 4542 resins are obtained in a dispersed form. One can also mechanically grind the material to small particle size and disperse in water for coating.

Particularly desirable phenolic developer resins are taught by commonly assigned U.S. Pat. No. 4,647,952 which is incorporated herein by reference to the extent necessary to complete this disclosure. The phenolic resins are capable of reacting with a color former and producing a visible image, and are represented by the formula (I):

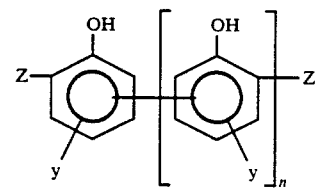

where n is greater than or equal to 2, the phenolic units are directly bonded to one another through the ortho and/or para positions, Y is present at the meta or para position and is selected from the group consisting of an alkyl group, a halogen atom (e.g., fluorine, chlorine, or bromine), an aryl group, a phenylalkyl group, an allyl group, a group of the formula —COOR where R is a hydrogen atom, an alkyl group or phenylalkyl group, an amino group of the formula —NR$_1$R$_2$ where R$_1$ and R$_2$ are the same or different and represent a hydrogen atom or a halogen atom, an aryl group, a phenylalkyl group, a —COOR group, or Z in conjunction with the adjacent meta position represents a condensed benzene ring which may be substituted or unsubstituted, and derivatives thereof obtained by reacting said developer resin with a metal salt.

In accordance with a more preferred embodiment of the invention, the developer resin is represented by the formula (II):

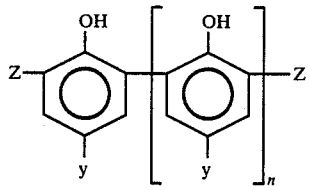

where n, Y, and Z are defined as in formula (I).

The developer resins can be homopolymers or copolymers, i.e., the Y and Z groups in given resin may be the same or different and the Y groups may be located at the meta and/or para positions in accordance with formula (I). When the Y substituent is in the para position and Z is other than hydrogen or a condensed benzene ring, the developer resin contains the Z substituent as a terminal group since, as explained below, the polymerization proceeds via a hydrogen abstraction at the ortho position. Consequently, when the phenol is para-substituted, the latter Z-substituted phenols are typically used in admixture with other 2,6-dihydrophenols to provide copolymers. When the para position is unsubstituted, polymerization proceeds via the ortho and-/or para position and the latter Z-substituted phenols can be incorporated mid chain.

The alkyl group represented by Y and Z may contain up to 10 carbon atoms and includes such alkyl groups as t-butyl, n-butyl, octyl, nonyl, etc. When R, $R_1$, and $R_2$ represent an alkyl group, it is typically an alkyl group having 1 to 4 carbon atoms.

When Y or Z is n aryl group, it is typically a phenyl group or a substituted phenyl group such as a halogen-substituted phenyl group, an alkyl-substituted phenyl group, or a phenol group such as a 4'-phenol group.

Representative examples of phenylalkyl groups include benzyl, isopropylidene phenyl, butylidene phenyl, isopropylidene-4'-phenol, and butylidene-4'-phenol.

The developer of the present invention may range from about 500 to 5000 in molecular weight (number average), and preferably, range from about 1000 to 3000. The developer resins are often mixtures of dimers, trimers, and higher molecular weight oligomers. The molecular weight distribution of the resin will vary depending upon the nature of the phenol and the reaction conditions. Usually, the major part of the resin (i.e., greater than 50% by weight of the resin) is trimer or higher molecular weight compound, i.e., n is greater than 2 in formulas (I) and (II).

The developer resins are preferably prepared by free radical addition polymerization of a phenol using a peroxide-peroxidase enzyme system. The oxidation of phenol by horseradish peroxidase and hydrogen peroxide is known, although previously it has been performed in aqueous systems. See Danner et al., "The Oxidation of Phenol and Its Reaction Product by Horseradish Peroxidase and Hydrogen Peroxide," *Archives of Biochemistry and Biophysics*, 156, 759 (1973)1; and Sanders et al., "Peroxidase," Butterworth, Inc., Washington, D.C. (1964). It has been found, however, that the reaction proceeds in higher yields and provides a higher molecular weight product if it is performed in an organic, and more preferably, an organic-aqueous solvent system.

Specific examples of phenols which can be polymerized with horseradish peroxidase are 4-t-butylphenol; 4-n-butylphenol; 4-ethylphenol; cresol; p-phenylphenol; poctylphenol; p-nonylphenol; p-hydroxybenzoic acid; 4-hydroxynaphthoic acid; 4,4'-biphenol; 4-aminosalicylic acid; salicylic acid; methyl salicylate; ethyl salicylate; 4,4'-isopropylidenediphenol; and ethyl 4-hydroxybenzoate, etc.

Typically, the ultraviolet absorber is mixed with the phenolic developer material in an amount of about 0.5 to 5.0 parts of ultraviolet absorber per 100 parts of phenolic developer material. Preferably, the ultraviolet absorber is mixed with the phenolic developer material in an amount of about 2.5 to 5.0 parts of ultraviolet absorber per 100 parts of phenolic developer material.

The optical brightener is mixed with the developer in an amount of about 10 to 0.1 parts/100 parts of developer material.

The support for the developer sheet may be transparent or opaque. In accordance with the most typical embodiments of the invention, the support is paper or a synthetic film such as polyethylene terephthalate.

The developer sheet of the present invention is prepared by coating a support with a coating composition of the finely divided phenolic developer material and the antiyellowing agent using conventional coating techniques. The coating composition is usually applied to the surface of the support in an amount of about 8 to 15 g/m² Depending upon the nature of the developer material and how it is obtained, a binder may be necessary to adhere the coating composition to the support.

The developer sheet can be subsequently heated, for example, by heating the developer sheet by contact with heated roller or a pair of heated rollers, or by passage of the developer sheet over a heated platen. Alternatively, the developer sheet can be placed in a hot oven. In another embodiment, the photosensitive imaging sheet can be assembled with the developer sheet layer heated simultaneously by passage through a pair of heated pressure rolls. This practice is, however, sometimes undesirable because the developer resin can coalesce before adequate reaction of the color former occurs.

Methods for coalescing the developer and glossing the developer sheet are disclosed in a number of commonly assigned patent applications including U.S. application Ser. Nos. 017,102 filed Feb. 19, 1987; 016,311 filed Feb. 19, 1987 and 155,795 filed Feb. 16, 1988.

The developer sheet of the present invention is particularly useful in a photosensitive imaging system. In the transfer imaging system of commonly assigned U.S. Pat. No. 4,399,209, the phenolic developer material and ultraviolet absorber are deposited on the surface of a separate support. In the transfer imaging system, the imaging sheet comprises a support having a layer of microcapsules on the surface thereof. After image-wise exposure, the imaging sheet and developer sheet are joined. Useful color formers, wall-forming materials, encapsulation techniques, coating techniques, imaging sheet supports, and exposure techniques are disclosed in U.S. Pat. No. 4,399,209. The microcapsules have an internal phase of a photosensitive composition and a color former. Useful photosensitive compositions are disclosed in commonly assigned Published European Application 0233587.

The microcapsules are then ruptured by passage through a pressure development apparatus so that the color former reacts with the phenolic developer material to form a visible image. Useful pressure development apparatus are disclosed in commonly assigned U.S. patent application Ser. Nos. 009,851 filed Feb. 2, 1987 and 039,393 filed Apr. 16, 1987. Other useful development techniques are disclosed in commonly assigned U.S. Pat. Nos. 4,448,51; 4,533,615; 4,578,340; and 4,592,986 and U.S. patent application Ser. No. 010,922 filed Feb. 5, 1987.

The present invention is more fully illustrated by the following non-limiting Examples.

EXAMPLE 1

The compounds used were Tinuvin 326 and 327 which are hydroxyphenylbenzotriazole ultraviolet absorbers commercially available from Ciba-Geigy. HRJ 4542 is a phenolic developer material commercially available from Schenectady Chemical Co. The following mixtures were coated on an 80 lb. Black and White glossy paper available from The Mead Corporation with a #16 Meyer rod:

| Sample | g HRJ 4542 (35% sol.) Developer | g Tinuvin 327 Absorber | g Tinuvin 326 Absorber |
|---|---|---|---|
| A | 20 | 0.10 | — |
| B | 20 | 0.25 | — |
| C | 20 | 0.50 | — |
| D | 20 | 1.00 | — |
| E | 20 | — | 0.10 |
| F | 20 | — | 0.25 |
| G | 20 | — | 0.50 |
| H | 20 | — | 1.00 |
| I(control) | 20 | — | — |

After drying, each developer sheet was heated to 160° C. for two minutes to fully coalesce the developer particles into a glossy layer. Samples were subjected to light from a Rayonet photoreactor which contained six 3500 Angstrom RPR blacklight tubes and ten F8T5/CW tubes for 15 hours. The air temperature of the chamber was 40° C. during this time. The yellow index (YI) of the samples was determined on a Hunter Lab-Scan and is shown below:

| Sample | A | B | C | D | E | F | G | H | I |
|---|---|---|---|---|---|---|---|---|---|
| YI | 24.0 | 17.3 | 14.5 | 13.7 | 24.5 | 18.4 | 15.7 | 14.4 | 26.6 |

A lower yellow index indicates less yellowing. Thus, the Table shows that addition of the hydroxyphenyl benzotriazole improved stability to photolytic yellowing.

Samples C, D, and I were also photolyzed without prior 160° C. heating to yield the following yellow indices:

| Sample | C | D | I |
|---|---|---|---|
| YI | 24.9 | 29.6 | 22.1 |

Thus, no improvement in yellowing is noted for the non-coalesced developer sheets containing ultraviolet absorber. As the melting points of both Tinuvin 326 and 327 are below 160° C., it is probable that these compounds melt during film coalescence and are distributed throughout the layer. If a film is not formed, the ultraviolet absorbers remain as particles and are relatively ineffective at protecting from yellowing.

EXAMPLE 2

To 20 g of 35% solids HRJ-4542 phenolic developer resin available from Schenectady Chemical Inc. was added 0.025 g of OB-8733, an experimental optical brightener from Ciba-Geigy. The mixture was well stirred and then coated on 80lb Black and White Glossy paper from The Mead Corporation with a #16 wire-wound rod. A control was coated which contained no brightener. Upon drying, both sheets were heated at 160° C to coalesce the coating into a continuous film. The Yellow Index of the control was 7.8 while that of the test sample was 2.8. Thus, it was shown that addition of an optical brightener can greatly lower the initial yellowness of the developer layer.

EXAMPLE 3

Test and control samples containing Tinopal (a commercially available optical brightener from Ciba-Geigy) were coated as below:

|  | Test | Control |
|---|---|---|
| 55% solids HRJ-4542 | 6.36 g | 6.36 g |
| Deionized Water | 3.64 g | 3.64 g |
| Tinopal | 0.037 g | — |

The samples were coated as above, with a #16 bar on 80lb Black and White Glossy and the layers coalesced by heating at 160° C. for one minute. Samples were photolyzed in the Rayonet Photochemical Reactor described in Example 1 for 17.5 hours. Separate samples were thermally aged at 70° C. for 70 hours. Yellowness Index was measured on each sample prior to aging and after thermal- and photo-aging. The values are listed below:

|  | Test | Control |
|---|---|---|
| Pre-aging YI | 2.8 | 7.8 |
| Thermally aged YI | 5.8 | 13.2 |
| Photo-aged YI | 26.4 | 30.6 |

Thus, it was shown that addition of an optical brightener improves the yellowness of the receiver layer both before photo or thermal yellowing and afterwards While the change in the Yellowness Index is about the same for the control and the test sample, this merely demonstrates that unlike the UV absorber, the optical brightener compensates for yellowing but does not prevent it.

Having described the invention in detail and by reference to preferred embodiments thereof, it will be apparent that modifications and variation are possible without departing from the scope of the invention defined in the appended claims.

What is claimed is:

1. A microencapsulated imaging system comprising an imaging sheet including a support having a layer of photosensitive microcapsules on the surface thereof, said microcapsules containing a photohardenable or photosoftenable photosensitive composition in the internal phase and having a color precursor associated therewith; and a developer sheet including a support having a layer on the surface of said support of a finely divided thermoplastic phenolic developer material and an anti-yellowing agent comprising an optical brightener, said developer material being capable of reacting with said color precursor to produce a visible image and coalescing into an essentially transparent film upon the application of heat.

2. The imaging system of claim 1 wherein said anti yellowing agent further comprises a hydrophenylbenzotriazole.

3. The imaging system of claim 2 wherein said hydroxyphenylbenzotriazole is a hydroxyphenylbenzotriazole selected from the group consisting of 2-(2'-hydroxy-3',5'-di-t-butylphenyl)-5-chlorobenzotriazole and 2-(2'-hydroxy-3'-t'-butyl-5'-methylphenyl)-5-chlorobenzotriazole.

4. The imaging system of claim 3 wherein said phenolic developer material is a metallated alkylphenolformaldehyde resin.

5. The imaging system of claim 1 wherein said phenolic developer material is a metallated condensation product of a phenol, formaldehyde, and salicylic acid.

6. The imaging system of claim 1 wherein said phenolic developer material is a product of oxidative coupling of a phenol or biphenol.

7. The imaging system of claim 6 wherein said phenol or biphenol is bisphenol-A.

8. The imaging system of claim 1 wherein said support is paper.

9. The imaging system of claim 1 wherein said support is a transparent film.

10. A process for producing images which comprises image-wise exposing to actinic radiation an imaging sheet including a support having a layer of microcapsules on the surface thereof, said microcapsules including a photohardenable or photosoftenable photosensitive composition as the internal phase and having a color precursor material associates therewith;

subjecting said imaging sheet to a uniform rupturing force such that said microcapsules rupture and release said internal phase in accordance with said imagewise exposure;

contacting said imaging sheet with a developer sheet including a support having a layer on the surface of said support of a finely divided thermoplastic phenolic developer material and an anti-yellowing agent comprising an optical brightener, said developer material being capable of reacting with said color precursor to produce a visible image and said developer material forming an essentially transparent film upon the application of heat, said contacting being conducted at the same time or immediately after subjecting said imaging sheet to said rupturing force; and fusing said developer material to form an essentially transparent film.

11. The process of claim 10 wherein said anti-yellowing agent further comprises a hydroxyphenylbenzotriazole.

12. The process of claim 11 wherein said hydroxyphenylbenzotriazole is 2-(2'-hydroxy-3',5'-di-t-butyl-5'-methylphenyl)-5-chlorobenzotriazole.

13. The process of claim 12 wherein said phenolic developer material is a metallated alkylphenol-formaldehyde resin.

14. The process of claim 10 wherein said phenolic developer material is a metallated condensation product of a phenol, formaldehyde, and salicylic acid.

15. The process of claim 10 where in said phenolic developer material is a product of oxidative coupling of a phenol or biphenol.

16. The process of claim 10 wherein said phenol or biphenol is bisphenol-A.

17. The process of claim 10 wherein said support is a transparent film.

18. The process of claim 10 wherein said support is a transparent film.

* * * * *